United States Patent
Ishizaki et al.

(10) Patent No.: US 10,920,143 B2
(45) Date of Patent: Feb. 16, 2021

(54) ETCHING LIQUID COMPOSITION AND ETCHING METHOD

(71) Applicant: ADEKA CORPORATION, Tokyo (JP)

(72) Inventors: Junro Ishizaki, Tokyo (JP); Daisuke Omiya, Tokyo (JP)

(73) Assignee: ADEKA CORPORATION, Tokyo (JP)

( * ) Notice: Subject to any disclaimer, the term of this patent is extended or adjusted under 35 U.S.C. 154(b) by 0 days.

(21) Appl. No.: 16/572,842

(22) Filed: Sep. 17, 2019

(65) Prior Publication Data
US 2020/0010762 A1 Jan. 9, 2020

Related U.S. Application Data

(63) Continuation-in-part of application No. 15/754,020, filed as application No. PCT/JP2016/074475 on Aug. 23, 2016, now abandoned.

(30) Foreign Application Priority Data

Aug. 26, 2015 (JP) .................. 2015-166964

(51) Int. Cl.
| | |
|---|---|
| *C09K 13/08* | (2006.01) |
| *C09K 13/06* | (2006.01) |
| *C23F 1/20* | (2006.01) |
| *C23F 1/26* | (2006.01) |
| *C23F 1/14* | (2006.01) |
| *C23F 1/44* | (2006.01) |
| *H01L 21/3213* | (2006.01) |
| *H01L 21/308* | (2006.01) |
| *H01L 21/768* | (2006.01) |
| *H01L 21/306* | (2006.01) |
| *H01L 21/3205* | (2006.01) |
| *H01L 23/532* | (2006.01) |

(52) U.S. Cl.
CPC .............. *C09K 13/08* (2013.01); *C09K 13/06* (2013.01); *C23F 1/14* (2013.01); *C23F 1/20* (2013.01); *C23F 1/26* (2013.01); *C23F 1/44* (2013.01); *H01L 21/306* (2013.01); *H01L 21/308* (2013.01); *H01L 21/30604* (2013.01); *H01L 21/3205* (2013.01); *H01L 21/3213* (2013.01); *H01L 21/32134* (2013.01); *H01L 21/768* (2013.01); *H01L 23/53214* (2013.01); *H01L 23/53257* (2013.01)

(58) Field of Classification Search
None
See application file for complete search history.

(56) References Cited

U.S. PATENT DOCUMENTS

| | | | | |
|---|---|---|---|---|
| 2011/0256712 A1* | 10/2011 | Lee | ........................... | C23F 1/10 438/652 |
| 2013/0270217 A1* | 10/2013 | Yoshida | ................... | C23F 1/44 216/13 |
| 2015/0034590 A1 | 2/2015 | Takahashi | | |
| 2016/0362804 A1 | 12/2016 | Chen | | |

FOREIGN PATENT DOCUMENTS

| | | |
|---|---|---|
| JP | 2001-59191 | 3/2001 |
| JP | 2008-288575 | 11/2008 |
| JP | 2013/522901 | 6/2013 |
| KR | 2014-0078924 | 6/2014 |
| WO | 2010/113711 | 10/2010 |
| WO | 2011/093445 | 8/2011 |

OTHER PUBLICATIONS

International Search Report dated Sep. 27, 2016 in International (PCT) Application No. PCT/JP2016/074475.

* cited by examiner

*Primary Examiner* — Jiong-Ping Lu
(74) *Attorney, Agent, or Firm* — Wenderoth, Lind & Ponack, L.L.P.

(57) ABSTRACT

An etching method that includes using the etching liquid composition containing (A) 0.1 to 15 mass % of hydrogen peroxide, (B) 0.01 to 1 mass % of a fluoride ion source, (C) 2-hydroxyethane sulfonic acid or a salt thereof in an amount of 0.1 to 20 mass % in terms of organic sulfonic acid, (D) 0.01 to 5 mass % of at least one compound selected from the group consisting of azole-based compounds and compounds having a structure that has a 6-membered heterocycle including at least one nitrogen atom and three double bonds, and (E) water, is provided.

4 Claims, No Drawings

ETCHING LIQUID COMPOSITION AND ETCHING METHOD

TECHNICAL FIELD

This invention relates to an etching liquid composition for etching a titanium-based layer and a copper-based layer of a laminate in one step that is disposed on a base material and includes at least one titanium-based layer and at least one copper-based layer; and an etching method that uses the etching liquid composition.

BACKGROUND ART

Wires made of copper and wires containing mainly copper are used as wiring materials in display devices such as flat panel displays in order to satisfy requirements such as increased size and higher resolution of displays, and use of titanium-based metals such as titanium and titanium nitride as barrier films is known. Various technologies that relate to wet etching of multilayer coating films based on copper and titanium are known.

For example, Patent Literature 1 (PTL 1) discloses an etching liquid which contains ammonium persulfate, an organic acid, an ammonium salt, a fluorine-containing compound, a glycol-based compound and an azole-based compound, and which enables a double layer film that contains titanium and copper to be etched. In addition, PTL 2 discloses an etching liquid that contains a fluoride ion source, hydrogen peroxide, a sulfate, a phosphate, an azole-based compound and a solvent.

CITATION LIST

Patent Literature

[PTL 1] Japanese Translation of PCT Application No. 2013-522901
[PTL 2] Japanese Patent Application Publication No. 2008-288575

SUMMARY OF INVENTION

Technical Problem

The cross sectional shape of fine line used in wiring and the like is preferably a cross sectional shape whereby the width at the lower part of the fine line is greater than the width at the upper part of the fine line. It is known that in the case of fine lines having this type of cross sectional shape, the fine line breakage is unlikely to occur. However, when forming a fine line formed of, for example, a laminate obtained by laminating a titanium-based layer and a copper-based layer on a base material by collectively etching a titanium-based layer and a copper-based layer of a laminate obtained by laminating at least one titanium-based layer and at least one copper-based layer on a base material, in cases where the etching liquids mentioned above are used continuously, problems occur such as the copper concentration in the etching liquid increasing due to eluted copper being dissolved in the etching liquid, meaning that it becomes impossible to obtain fine lines having a desired cross sectional shape.

Therefore, the purpose of this invention is to solve the problem mentioned above. In other words, the purpose of this invention is to provide an etching liquid composition which enables fine lines having a desired cross sectional shape to be obtained even when the copper concentration in the etching liquid increases due to the same etching liquid being used continuously when collectively etching a titanium-based layer and a copper-based layer of a laminate obtained by laminating at least one titanium-based layer and at least one copper-based layer on a base material, and by which the amount of tapering of a fine line generated by an etching treatment is low.

Solution to the Problem

As a result of diligent research into how to solve the problem mentioned above, the inventors of this invention found that the problem mentioned above could solved by an etching liquid composition that contains (A) 0.1 to 15 mass % of hydrogen peroxide, (B) 0.01 to 1 mass % of a fluoride ion source, (C) an organic sulfonic acid represented by general formula (I) or a salt thereof in an amount of 0.1 to 20 mass % in terms of organic sulfonic acid, (D) 0.01 to 5 mass % of at least one type of compound selected from among azole-based compounds and compounds having a structure that has a 6-membered heterocycle including at least one nitrogen atom and three double bonds, and (E) water, and thereby completed this invention.

(In the formula, R represents an alkyl group having 1 to 4 carbon atoms, a hydroxyalkyl group having 1 to 4 carbon atoms, an aryl group having 6 to 10 carbon atoms or a hydroxyaryl group having 6 to 10 carbon atoms.)

That is, this invention provides an etching liquid composition for etching a titanium-based layer and a copper-based layer of a laminate in one step that is disposed on a base material and includes at least one titanium-based layer and at least one copper-based layer, the etching liquid composition being characterized by containing (A) 0.1 to 15 mass % of hydrogen peroxide, (B) 0.01 to 1 mass % of a fluoride ion source, (C) an organic sulfonic acid represented by general formula (I) or a salt thereof in an amount of 0.1 to 20 mass % in terms of organic sulfonic acid, (D) 0.01 to 5 mass % of at least one type of compound selected from among azole-based compounds and compounds having a structure that has a 6-membered heterocycle including at least one nitrogen atom and three double bonds, and (E) water.

In addition, this invention provides an etching method which includes using the etching liquid composition mentioned above and which collectively etches a titanium-based layer and a copper-based layer of a laminate obtained by laminating at least one titanium-based layer and at least one copper-based layer on a base material.

Advantageous Effects of Invention

With the etching liquid composition according to this invention and etching method that includes using the etching liquid composition, it is possible to obtain a fine line having a desired cross sectional shape even when the copper concentration in the etching liquid increases due to the etching liquid being used continuously when collectively etching a titanium-based layer and a copper-based layer of a laminate obtained by laminating a titanium-based layer and a copper-based layer on a base material. In other words, even if the etching liquid composition of this invention is re-used or used repeatedly, excellent etching performance can be maintained and the frequency with which the etching liquid needs replacing can be reduced. Furthermore, it is possible to obtain a product in which the amount of tapering of a fine line generated by an etching treatment is low.

DESCRIPTION OF EMBODIMENTS

Embodiments of this invention will now be explained in detail.

Base materials commonly used in the technical field of etching can be used as the base material used in this invention. For example, it is possible to use glass and silicon.

In this invention, an etching target (a material to be etched) is a laminate formed by laminating at least one titanium-based layer and at least one copper-based layer on the base material. In other words, this laminate corresponds to a multilayer coating film disposed on a base material.

The laminate includes at least one titanium-based layer and at least one copper-based layer. The laminate may have one or two or more titanium-based layers. In addition, the laminate may have one or two or more copper-based layers. In such a laminate that includes titanium-based layers and copper-based layers, a copper-based layer may be above a titanium-based layer, below a titanium-based layer, or above and below a titanium-based layer. In addition, titanium-based layers and copper-based layers may be alternately laminated. Moreover, the laminate used in this invention may contain other layers as long as the advantageous effect of this invention is not impaired, but the laminate preferably consists of the titanium-based layers and the copper-based layers.

The "titanium-based layer" disclosed in the present description is not particularly limited as long as the layer contains titanium, but an example thereof is an electrically conductive layer that contains 50% or more, preferably 60% or more, and more preferably 70% or more, of titanium in terms of mass. Specifically, "titanium-based layer" is a generic term for a layer formed of one or more materials selected from among metallic titanium and titanium alloys such as a titanium-nickel alloy.

The "copper-based layer" disclosed in the present description is not particularly limited as long as the layer contains copper, but an example thereof is an electrically conductive layer that contains 50% or more, preferably 60% or more, and more preferably 70% or more, of copper in terms of mass. "Copper-based layer" is a generic term for a layer formed of one or more materials selected from among, for example, metallic copper and copper alloys such as a copper-nickel alloy.

The concentration of hydrogen peroxide (A) (hereinafter abbreviated to component (A) in some cases) used in the etching liquid composition of this invention falls within the range 0.1 to 15 mass %. The concentration of component (A) can be adjusted as appropriate within the numerical range mentioned above according to the desired thickness or width of a laminate obtained by laminating a titanium-based layer and copper-based layer, which is the material to be etched. However, in order to facilitate control of etching speed, it is particularly preferable for the concentration of component (A) to be 0.5 to 10 mass %. If the concentration of component (A) is less than 0.1 mass %, a satisfactory etching speed cannot be achieved. Meanwhile, if the concentration of component (A) exceeds 15 mass %, it may be difficult to control the etching speed.

The fluoride ion source (B) (hereinafter abbreviated to component (B) in some cases) used in the etching liquid composition of this invention is not particularly limited as long as fluoride ions are generated in the etching liquid composition, but examples thereof include hydrofluoric acid, ammonium fluoride, ammonium hydrogen fluoride, sodium fluoride, potassium fluoride and lithium fluoride. In the case of alkali metal fluorides, because alkali metals may, in some cases, remain in the base material being etched following an etching treatment, use of hydrofluoric acid, ammonium fluoride or ammonium hydrogen fluoride is preferred.

The concentration of component (B) in the etching liquid composition of this invention falls within the range 0.01 to 1 mass %. The concentration of component (B) can be adjusted as appropriate within the numerical range mentioned above according to the desired thickness or width of a laminate obtained by laminating a titanium-based layer and copper-based layer, which is the material to be etched, but it is particularly preferable for the concentration of component (B) to be 0.05 to 0.5 mass %. If the concentration of component (B) is less than 0.01 mass %, a satisfactory etching speed cannot be achieved. Meanwhile, if the concentration of component (B) exceeds 1 mass % %, in cases where glass is used as the base material to be etched, the glass may, in some cases, be eroded.

In the organic sulfonic acid (C) represented by general formula (I) (hereinafter abbreviated to component (C) in some cases) used in the etching liquid composition of this invention, R represents an alkyl group having 1 to 4 carbon atoms, a hydroxyalkyl group having 1 to 4 carbon atoms, an aryl group having 6 to 10 carbon atoms or a hydroxyaryl group having 6 to 10 carbon atoms.

Examples of alkyl groups having 1 to 4 carbon atoms include methyl groups, ethyl groups, propyl groups, isopropyl groups, butyl groups, secondary butyl groups and tertiary butyl groups. Moreover, "alkyl group" means an unsubstituted alkyl group.

Examples of hydroxyalkyl groups having 1 to 4 carbon atoms include hydroxymethyl groups, 1-hydroxyethyl groups, 2-hydroxyethyl groups, 1-hydroxypropyl groups, 2-hydroxypropyl groups, 3-hydroxypropyl groups, 1-hydroxyisopropyl groups, 2-hydroxyisopropyl groups, 1-hydroxybutyl groups, 2-hydroxybutyl groups, 3-hydroxybutyl groups and 4-hydroxybutyl groups.

Examples of aryl groups having 6 to 10 carbon atoms include phenyl groups, benzyl groups, tolyl groups, o-xylyl groups, m-xylyl groups and p-xylyl groups.

Examples of hydroxyaryl groups having 6 to 10 carbon atoms include 2-hydroxyphenyl groups, 3-hydroxyphenyl groups and 4-hydroxyphenyl groups.

Component (C) used in the etching liquid composition of this invention is not particularly limited, but methane sulfonic acid, ethane sulfonic acid, hydroxymethane sulfonic acid, 2-hydroxyethane sulfonic acid, benzene sulfonic acid, o-toluene sulfonic acid, m-toluene sulfonic acid, p-toluene sulfonic acid, 2-hydroxyethane sulfonic acid, o-phenol sulfonic acid, m-phenolsulfonic acid, p-phenol sulfonic acid and salts thereof, and the like, can be advantageously used. Of these, cases where methane sulfonic acid, 2-hydroxyethane sulfonic acid, benzene sulfonic acid, p-toluene sulfonic acid, p-phenol sulfonic acid or a salt thereof is used are preferred because it is possible to obtain a fine line having a desired shape following an etching treatment even if copper is eluted in the etching liquid composition, and of these, 2-hydroxyethane sulfonic acid, benzene sulfonic acid and salts thereof are preferred due to exhibiting a particularly high effect. Alkali metal salts such as sodium salts, potassium salts and lithium salts can be advantageously used.

The concentration of component (C) in the etching liquid composition of this invention falls within the range 0.1 to 20 mass % in terms of organic sulfonic acid. The concentration of component (C) can be adjusted as appropriate within the numerical range mentioned above according to the desired thickness or width of a laminate obtained by laminating a titanium-based layer and copper-based layer, which is the material to be etched, but the concentration of component (C) is preferably 0.5 to 15 mass %, and more preferably 1 to 10 mass %. If the concentration of component (C) is less than 0.1 mass %, etching performance may, in some cases, deteriorate if the etching liquid is used continuously for a long period of time. Meanwhile, if the concentration of component (C) exceeds 20 mass %, it may be difficult to control the etching speed. Component (C) may be a mixture of two or more compounds, but cases in which a single compound is used are preferred.

An explanation will now be given of the at least one type of compound (D) selected from among azole-based compounds and compounds having a structure that has a 6-membered heterocycle including at least one nitrogen atom and three double bonds (hereinafter abbreviated to component (D) in some cases) used in the etching liquid composition of this invention.

The azole-based compound is not particularly limited, and should be a compound having a structure that has a 5-membered ring including at least one nitrogen atom and two double bonds, but an azole-based compound having 1 to 3 carbon atoms is preferred, and an azole-based compound having 1 or 2 carbon atoms is more preferred. Examples thereof include azole-based compounds such as alkylpyrrole compounds such as 1-methylpyrrole and pyrrole; diazole compounds such as alkylimidazole compounds such as 1-methylimidazole, adenine, 1,3-imidazole (hereinafter abbreviated to imidazole in some cases) and pyrazole; triazole compounds such as 1,2,4-triazole, 5-methyl-1H-benzotriazole, 1H-benzotriazole (hereinafter abbreviated to benzotriazole in some cases) and 3-amino-1H-triazole; tetrazole compounds such as 1H-tetrazole, 5-methyl-1H-tetrazole, 5-phenyl-1H-tetrazole and 5-amino-1H-tetrazole (hereinafter abbreviated to 5-aminotetrazole in some cases); thiazole compounds such as 1,3-thiazole, 4-methylthiazole and isothiazole; and oxazole compounds such as isooxazole. Of these, adenine, triazole compounds and tetrazole compounds are preferred, and of these, 1,2,4-triazole, 3-amino-1H-triazole, 1H-tetrazole, 5-methyl-1H-tetrazole and 5-aminotetrazole are particularly preferred.

The compound having a structure that has a 6-membered heterocycle including at least one nitrogen atom and three double bonds (hereinafter abbreviated to "a pyridine-based compound" in some cases) is not particularly limited, and should be a compound having a structure that has a 6-membered heterocycle including at least one nitrogen atom and three double bonds, but a pyridine-based compound having 2 to 10 carbon atoms is preferred, and a pyridine-based compound having 2 to 7 carbon atoms is more preferred. Examples thereof include alkylpyridine compounds such as 2-methylpyridine, aminopyridine compounds such as 2-aminopyridine and 2-(2-aminoethyl)pyridine, pyridine, pyrazine, pyrimidine, pyridazine, triazine and tetrazine, with aminopyridine compounds being preferred, and 2-aminopyridine being particularly preferred.

The concentration of component (D) in the etching liquid composition of this invention falls within the range 0.01 to 5 mass %. The concentration of component (D) can be adjusted as appropriate within the numerical range mentioned above according to the desired thickness or width of a laminate obtained by laminating a titanium-based layer and copper-based layer, which is the material to be etched, but it is particularly preferable for the concentration of component (D) to be 0.05 to 2 mass %. If the concentration of component (D) is less than 0.01 mass %, a fine line having a cross sectional shape in which the width at the upper part of the fine line is not less than the width at the lower part of the fine line may be produced following etching. Meanwhile, even if more than 5 mass % of component (D) is added, no improvement in the effect achieved by component (D) can be expected. In cases where an azole-based compound or pyridine-based compound is used in isolation, the concentration of component (D) means the concentration of the azole-based compound or pyridine-based compound, and in cases where mixtures of azole-based compounds or pyridine-based compounds are used, the concentration of component (D) means the sum of the concentrations of the azole-based compounds or pyridine-based compounds. In cases where a mixture of an azole-based compound and a pyridine-based compound is used, the ratio of the concentration of the azole-based compound and the concentration of the pyridine-based compound preferably falls within the range 1:30 to 30:1, more preferably falls within the range 1:25 to 25:1, and a case in which this ratio falls within the range 1:5 to 5:1 is particularly preferred because the effect achieved by adding component (D) is particularly high. Component (D) may be a mixture of two or more compounds, but cases in which a single compound is used are preferred.

In addition to component (A), component (B), component (C) and component (D) described above, it is possible to blend other well-known additives in the etching liquid composition of this invention at levels that do not impair the effect of this invention. Examples of such additives include stabilizers for the etching liquid composition, solubilizing agents for the components in the composition, anti-foaming agents, pH adjusting agents, specific gravity adjusting agents, viscosity modifiers, wettability improving agents, chelating agents, oxidizing agents, reducing agents and surfactants, and in cases where these additives are used, the concentration thereof is generally 0.001 to 50 mass % per additive.

Examples of pH-adjusting agents include inorganic acids such as hydrochloric acid, sulfuric acid and nitric acid, and salts thereof, water-soluble organic acids and salts thereof, alkali metal hydroxides such as lithium hydroxide, sodium hydroxide and potassium hydroxide, alkaline earth metal hydroxides such as calcium hydroxide, strontium hydroxide and barium hydroxide, carbonates such as ammonium carbonate and alkali metal carbonates such as lithium carbonate, sodium carbonate and potassium carbonate, alkali metal bicarbonates such as sodium bicarbonate and potassium bicarbonate, quaternary ammonium hydroxides such as tetramethyl ammonium hydroxide and choline, organic amines such as ethylamine, diethylamine, triethylamine and hydroxyethylamine, ammonium bicarbonate and ammonia, and it is possible to use one of these compounds or a mixture of two or more types thereof. In cases where these pH-adjusting agents are used, the agents should be added so as to achieve the desired pH. The pH of the etching liquid composition of the invention of the present application preferably falls within the range of 1 to 3, and particularly preferably falls within the range of 1 to 2. If the pH is lower than 1, the copper etching speed becomes too fast and it may not be possible to control the etching speed. If the pH is higher than 3, the stability of the hydrogen peroxide deteriorates, the speed of dissolution of the copper, and especially the titanium, becomes extremely slow, and etching may take a long time.

It is possible to add one or two or more non-ionic surfactants, cationic surfactants and amphoteric surfactants as the surfactant mentioned above. Examples of non-ionic surfactants include polyoxyalkylene alkyl ethers, polyoxyalkylene alkenyl ethers, polyoxyethylene-polyoxypropylene alkyl ethers (the mode of addition of ethylene oxide and propylene oxide may be random or block-like), polyethylene glycol-propylene oxide adducts, polypropylene glycol-ethylene oxide adducts, random or block adducts of ethylene oxide and propylene oxide to alkylenediamines, glycerol fatty acid esters and ethylene oxide adducts thereof, sorbitan fatty acid esters, polyoxyethylene sorbitan fatty acid esters, alkylpolyglucosides, fatty acid monoethanolamides and ethylene oxide adducts thereof, fatty acid-N-methylmonoethanolamide and ethylene oxide adducts thereof, fatty acid diethanolamides and ethylene oxide adducts thereof, sucrose fatty acid esters, alkyl (poly)glycerol ethers, polyglycerol fatty acid esters, polyethylene glycol fatty acid esters, fatty acid methyl ester ethoxylates and N-long chain alkyl dimethylamine oxides. Of these, cases where random or block adducts of ethylene oxide and propylene oxide to alkylene diamines are used are preferred because an obtained fine line exhibits good linearity and the storage stability of the etching liquid is good. Among random or block adducts of ethylene oxide and propylene oxide to alkylene diamines, cases where reverse type adducts are used are more preferred from the perspective of low-foam properties. Examples of cationic surfactants include alkyl (or alkenyl) trimethyl ammonium salts, dialkyl (or alkenyl) dimethyl ammonium salts, alkyl (or alkenyl) quaternary ammonium salts, mono- or di-alkyl (or alkenyl) quaternary ammonium salts having an ether group, an ester group or an amide group, alkyl (or alkenyl) pyridinium salts, alkyl (or alkenyl) dimethylbenzyl ammonium salts, alkyl (or alkenyl) isoquinolinium salts, dialkyl (or alkenyl) morphonium salts, polyoxyethylene alkyl (or alkenyl) amines, alkyl (or alkenyl) amine salts, polyamine fatty acid derivatives, amyl alcohol fatty acid derivatives, benzalkonium chloride and benzethonium chloride. Examples of amphoteric surfactants include carboxybetaines, sulfobetaines, phosphobetaines, amidoamino acids and imidazolinium betaine-based surfactants. In cases where these surfactants are used, the concentration thereof generally falls within the range 0.001 to 10 mass %.

The etching liquid composition of this invention contains water (E) in addition to the components mentioned above. An aqueous solution containing the required quantities of the components mentioned above is preferred.

An etching method which uses the etching liquid composition of this invention to collectively etch a titanium-based layer and a copper-based layer of a laminate obtained by laminating the titanium-based layer and the copper-based layer on a base material is not particularly limited, and an ordinary well-known etching method should be used. Examples thereof include dip type, spray type and spin type etching methods.

For example, in cases where a base material obtained by laminating titanium and then copper on a glass substrate is etched using a spray type etching method, by spraying the etching liquid composition of this invention onto the base material under appropriate conditions, it is possible to etch the titanium coating film and copper coating film on the glass substrate.

The etching conditions are not particularly limited, and can be set arbitrarily according to the form and thickness of the object being etched. For example, spraying conditions are preferably 0.01 Mpa to 0.2 Mpa, and particularly preferably 0.01 Mpa to 0.1 Mpa. In addition, the etching temperature is preferably 10° C. to 50° C., and particularly preferably 20° C. to 50° C. Because the temperature of the etching liquid can, in some cases, increase due to the heat of reaction, the temperature may, if necessary, be controlled by a publicly known means in order to maintain the temperature range mentioned above. In addition, the etching time is not particularly limited, but this time should be sufficient for the object being etched to be completely etched. For example, for an etching target having a film thickness of approximately 1 μm, a line width of approximately 10 μm and an opening size of approximately 100 μm, it is preferable for etching to be carried out for approximately 10 to 300 seconds within the temperature range mentioned above.

The etching liquid composition and etching method using same of this invention is used mainly to process electrodes and wiring of liquid crystal displays, plasma displays, touch panels, organic EL devices, solar cells, lighting fixtures, and the like.

EXAMPLES

This invention will now be explained in greater detail through the use of examples and comparative examples, but this invention is not limited to these examples.

Example 1

Example composition Nos. 1 to 11 were obtained by formulating etching liquid compositions according to the formulations shown in Table 1. In these example compositions, the balance excluding components (A) to (D) shown in Table 1 was made up of water.

TABLE 1

| Example composition | Component (A) (mass %) | Component (B) (mass %) | Component (C) (mass %) | Component (D) (mass %) |
|---|---|---|---|---|
| No. 1 | Hydrogen peroxide (5) | Ammonium hydrogen fluoride (0.1) | Methane sulfonic acid (1) | 5-amino-tetrazole (0.2) |
| No. 2 | Hydrogen peroxide (5) | Ammonium hydrogen fluoride (0.1) | 2-hydroxy-ethane sulfonic acid (9) | 5-amino-tetrazole (0.2) |
| No. 3 | Hydrogen peroxide (5) | Ammonium hydrogen fluoride (0.1) | Benzene sulfonic acid (10) | 5-amino-tetrazole (0.2) |
| No. 4 | Hydrogen peroxide (5) | Ammonium hydrogen fluoride (0.1) | p-toluene sulfonic acid (3) | 5-amino-tetrazole (0.2) |
| No. 5 | Hydrogen peroxide (5) | Ammonium hydrogen fluoride (0.1) | Phenol sulfonic acid (1) | 5-amino-tetrazole (0.2) |
| No. 6 | Hydrogen peroxide (5) | Ammonium hydrogen fluoride (0.1) | 2-hydroxy-ethane sulfonic acid (9) | 2-amino-pyridine (0.2) |

TABLE 1-continued

| Example composition | Component (A) (mass %) | Component (B) (mass %) | Component (C) (mass %) | Component (D) (mass %) |
|---|---|---|---|---|
| No. 7 | Hydrogen peroxide (5) | Ammonium hydrogen fluoride (0.1) | 2-hydroxy-ethane sulfonic acid (9) | Adenine (0.2) |
| No. 8 | Hydrogen peroxide (5) | Ammonium hydrogen fluoride (0.1) | 2-hydroxy-ethane sulfonic acid (9) | 1,2,4-triazole (1) |
| No. 9 | Hydrogen peroxide (5) | Ammonium hydrogen fluoride (0.1) | 2-hydroxy-ethane sulfonic acid (9) | 3-amino-1H-triazole (1.5) |
| No. 10 | Hydrogen peroxide (5) | Ammonium hydrogen fluoride (0.1) | 2-hydroxy-ethane sulfonic acid (9) | 1H-tetrazole (0.2) |
| No. 11 | Hydrogen peroxide (5) | Ammonium hydrogen fluoride (0.1) | 2-hydroxy-ethane sulfonic acid (9) | 5-methyl-1H-tetrazole (0.2) |

Production Example 1

Comparative compositions 1 to 3 were obtained by formulating etching liquid compositions according to the formulations shown in Table 2. In these comparative example compositions, the balance excluding components (A) to (D) shown in Table 2 was made up of water.

TABLE 2

| Comparative composition | Component (A) (mass %) | Component (B) (mass %) | Component (C) (mass %) | Component (D) (mass %) |
|---|---|---|---|---|
| 1 | Hydrogen peroxide (5) | Ammonium hydrogen fluoride (0.1) | None | 5-amino-tetrazole (0.2) |
| 2 | Hydrogen peroxide (5) | Ammonium hydrogen fluoride (0.1) | Sulfuric acid (1) | 5-amino-tetrazole (0.2) |
| 3 | Hydrogen peroxide (5) | Ammonium hydrogen fluoride (0.1) | Aminoethane sulfonic acid (3) | 5-amino-tetrazole (0.2) |

Example 2

A plurality of small plates were prepared by cutting 10 mm×10 mm plates from a substrate obtained by forming a resist pattern having a line width of 10 µm and an opening size of 100 µm using a positive type liquid resist on a base material obtained by laminating titanium (30 nm) and copper (400 nm) in that order on a glass sheet, and these small plates were used as test pieces. These test pieces were subjected to pattern etching by means of a dipping method at 35° C. using example composition Nos. 1 to 13, in which copper was dissolved at a prescribed concentration. The etching treatment time for each etching liquid composition was the length of time after which it could be confirmed by eye that copper residue between fine lines had been eliminated. The etching treatment time was within 3 minutes in each case.

Comparative Example 1

Pattern etching was carried out with comparative compositions 1 to 3 using the same method as that used in Example 2.

Evaluation Example 1

For the test pieces obtained in Example 2 and Comparative Example 1, it was confirmed whether or not fine lines had been formed by checking the upper part of the test pieces using an optical microscope, and the cross sectional shape of the test pieces was also checked using a FE-SEM.

When carrying out these evaluations, etched test pieces were evaluated when the concentration of copper in the etching liquid composition was set to a prescribed concentration. The results are shown in Tables 3 to 5. Cases where the cross sectional shape was such that the width at the lower part of the fine line was greater than the width at the upper part of the fine line were evaluated as O (pass), and cases where the cross sectional shape was such that the width at the lower part of the fine line were smaller than the width at the upper part of the fine line was evaluated as X (fail). In addition, cases where the amount of tapering on one side of a wire was less than 1.0 µm were evaluated as ++, cases where the amount of tapering on one side of a wire was not less than 1.0 µm but less than 2.0 µm were evaluated as +, and cases where the amount of tapering on one side of a wire was 2.0 µm or more and cases where fine lines could not be formed were evaluated as −−.

TABLE 3

| | Etching liquid composition | Copper concentration/ppm | Cross sectional shape | Amount of tapering of wire |
|---|---|---|---|---|
| Evaluation Example 1-1 | Example composition No. 1 | 0 | O | ++ |
| Evaluation Example 1-2 | Example composition No. 1 | 1000 | O | ++ |
| Evaluation Example 1-3 | Example composition No. 1 | 2000 | O | ++ |
| Evaluation Example 1-4 | Example composition No. 2 | 0 | O | ++ |
| Evaluation Example 1-5 | Example composition No. 2 | 1000 | O | ++ |
| Evaluation Example 1-6 | Example composition No. 2 | 2000 | O | ++ |
| Evaluation Example 1-7 | Example composition No. 2 | 5000 | O | ++ |
| Evaluation Example 1-8 | Example composition No. 3 | 0 | O | ++ |
| Evaluation Example 1-9 | Example composition No. 3 | 1000 | O | ++ |
| Evaluation Example 1-10 | Example composition No. 3 | 2000 | O | ++ |
| Evaluation Example 1-11 | Example composition No. 3 | 5000 | O | ++ |
| Evaluation Example 1-12 | Example composition No. 4 | 0 | O | ++ |
| Evaluation Example 1-13 | Example composition No. 4 | 1000 | O | ++ |
| Evaluation Example 1-14 | Example composition No. 4 | 2000 | O | ++ |
| Evaluation Example 1-15 | Example composition No. 5 | 0 | O | ++ |
| Evaluation Example 1-16 | Example composition No. 5 | 1000 | O | + + |
| Evaluation Example 1-17 | Example composition No. 5 | 2000 | O | + + |
| Evaluation Example 1-18 | Example composition No. 6 | 0 | O | + |
| Evaluation Example | Example composition No. 6 | 1000 | O | + |

TABLE 3-continued

| | Etching liquid composition | Copper concentration/ppm | Cross sectional shape | Amount of tapering of wire |
|---|---|---|---|---|
| Example 1-19 | composition No. 6 | | | |
| Evaluation Example 1-20 | Example composition No. 6 | 2000 | ○ | + |

TABLE 4

| | Etching liquid composition | Copper concentration/ppm | Cross sectional shape | Amount of tapering of wire |
|---|---|---|---|---|
| Evaluation Example 1-21 | Example composition No. 7 | 0 | ○ | + |
| Evaluation Example 1-22 | Example composition No. 7 | 1000 | ○ | + |
| Evaluation Example 1-23 | Example composition No. 7 | 2000 | ○ | + |
| Evaluation Example 1-24 | Example composition No. 8 | 0 | ○ | ++ |
| Evaluation Example 1-25 | Example composition No. 8 | 1000 | ○ | ++ |
| Evaluation Example 1-26 | Example composition No. 8 | 2000 | ○ | ++ |
| Evaluation Example 1-27 | Example composition No. 8 | 5000 | ○ | + |
| Evaluation Example 1-28 | Example composition No. 9 | 0 | ○ | ++ |
| Evaluation Example 1-29 | Example composition No. 9 | 1000 | ○ | ++ |
| Evaluation Example 1-30 | Example composition No. 9 | 2000 | ○ | ++ |
| Evaluation Example 1-31 | Example composition No. 9 | 5000 | ○ | + |
| Evaluation Example 1-32 | Example composition No. 10 | 0 | ○ | ++ |
| Evaluation Example 1-33 | Example composition No. 10 | 1000 | ○ | ++ |
| Evaluation Example 1-34 | Example composition No. 10 | 2000 | ○ | ++ |
| Evaluation Example 1-35 | Example composition No. 10 | 5000 | ○ | + |
| Evaluation Example 1-36 | Example composition No. 11 | 0 | ○ | ++ |
| Evaluation Example 1-37 | Example composition No. 11 | 1000 | ○ | ++ |
| Evaluation Example 1-38 | Example composition No. 11 | 2000 | ○ | ++ |
| Evaluation Example 1-39 | Example composition No. 11 | 5000 | ○ | + |

TABLE 5

| | Etching liquid composition | Copper concentration/ppm | Cross sectional shape | Amount of tapering of wire |
|---|---|---|---|---|
| Comparative Example 1 | Comparative composition 1 | 0 | — *1 | -- |
| Comparative Example 2 | Comparative composition 1 | 1000 | — *1 | -- |
| Comparative Example 3 | Comparative composition 1 | 2000 | — *1 | -- |
| Comparative Example 4 | Comparative composition 2 | 0 | — *2 | -- |
| Comparative Example 5 | Comparative composition 2 | 1000 | — *2 | -- |
| Comparative Example 6 | Comparative composition 2 | 2000 | — *2 | -- |
| Comparative Example 7 | Comparative composition 3 | 0 | — *1 | -- |
| Comparative Example 8 | Comparative composition 3 | 1000 | — *1 | -- |

TABLE 5-continued

| | Etching liquid composition | Copper concentration/ppm | Cross sectional shape | Amount of tapering of wire |
|---|---|---|---|---|
| Comparative Example 9 | Comparative composition 3 | 2000 | — *1 | -- |

*1: Even after etching for 5 minutes or more, the material to be etched was not sufficiently etched and fine lines could not be formed.
*2: The etching speed could not be controlled, the material to be etched was completely dissolved within a few seconds, and fine lines could not be formed.

From the results in Tables 3 to 5, it can be seen that in all of Evaluation Examples 1-1 to 1-39, it was possible to form wires having cross sectional shapes in which the width at the lower part of the fine line was greater than the width at the upper part of the fine line. Of these, in Evaluation Examples 1-7 and 1-11, the desired wires could be formed and the amount of tapering of the wires was low even though the concentration of copper in the etching liquid was 5000 ppm. Meanwhile, wires could not be formed in any of Comparative Examples 1 to 9.

Evaluation Example 2

For the test pieces obtained in Example 2 and Comparative Example 1, wire linearity was observed using a laser microscope. The wire linearity was evaluated based on variations in wire width.

Cases where the variations of wire width were less than 0.5 μm were evaluated as ++, and cases where the variations of wire width were equal to or more than 0.5 μm were evaluated as --. In addition, the variations of wire width were calculated by the following equation:

"Variation of wire width"="maximum value of wire width"−"minimum value of wire width"

When carrying out these evaluations, etched test pieces were evaluated when the concentration of copper in the etching liquid composition was set to a prescribed concentration.

TABLE 6

| | Etching liquid composition | Copper concentration/ppm | Variation of wire width |
|---|---|---|---|
| Evaluation Example 2-1 | Example composition No. 1 | 0 | ++ |
| Evaluation Example 2-2 | Example composition No. 1 | 1000 | -- |
| Evaluation Example 2-3 | Example composition No. 1 | 2000 | -- |
| Evaluation Example 2-4 | Example composition No. 2 | 0 | ++ |
| Evaluation Example 2-5 | Example composition No. 2 | 1000 | ++ |
| Evaluation Example 2-6 | Example composition No. 2 | 2000 | ++ |
| Evaluation Example 2-7 | Example composition No. 2 | 5000 | ++ |
| Evaluation Example 2-8 | Example composition No. 3 | 0 | ++ |
| Evaluation Example 2-9 | Example composition No. 3 | 1000 | -- |
| Evaluation Example 2-10 | Example composition No. 3 | 2000 | -- |
| Evaluation Example 2-11 | Example composition No. 3 | 5000 | -- |
| Evaluation Example 2-12 | Example composition No. 4 | 0 | ++ |
| Evaluation Example 2-13 | Example composition No. 4 | 1000 | -- |

TABLE 6-continued

| | Etching liquid composition | Copper concentration/ppm | Variation of wire width |
|---|---|---|---|
| Evaluation Example 2-14 | Example composition No. 4 | 2000 | -- |
| Evaluation Example 2-15 | Example composition No. 5 | 0 | ++ |
| Evaluation Example 2-16 | Example composition No. 5 | 1000 | -- |
| Evaluation Example 2-17 | Example composition No. 5 | 2000 | -- |
| Evaluation Example 2-18 | Example composition No. 6 | 0 | ++ |
| Evaluation Example 2-19 | Example composition No. 6 | 1000 | ++ |
| Evaluation Example 2-20 | Example composition No. 6 | 2000 | ++ |

TABLE 7

| | Etching liquid composition | Copper concentration/ppm | Variation of wire width |
|---|---|---|---|
| Evaluation Example 2-21 | Example composition No. 7 | 0 | ++ |
| Evaluation Example 2-22 | Example composition No. 7 | 1000 | ++ |
| Evaluation Example 2-23 | Example composition No. 7 | 2000 | ++ |
| Evaluation Example 2-24 | Example composition No. 8 | 0 | ++ |
| Evaluation Example 2-25 | Example composition No. 8 | 1000 | ++ |
| Evaluation Example 2-26 | Example composition No. 8 | 2000 | ++ |
| Evaluation Example 2-27 | Example composition No. 8 | 5000 | ++ |
| Evaluation Example 2-28 | Example composition No. 9 | 0 | ++ |
| Evaluation Example 1-29 | Example composition No. 9 | 1000 | ++ |
| Evaluation Example 2-30 | Example composition No. 9 | 2000 | ++ |
| Evaluation Example 2-31 | Example composition No. 9 | 5000 | ++ |
| Evaluation Example 2-32 | Example composition No. 10 | 0 | ++ |
| Evaluation Example 2-33 | Example composition No. 10 | 1000 | ++ |
| Evaluation Example 2-34 | Example composition No. 10 | 2000 | ++ |
| Evaluation Example 2-35 | Example composition No. 10 | 5000 | ++ |
| Evaluation Example 2-36 | Example composition No. 11 | 0 | ++ |
| Evaluation Example 2-37 | Example composition No. 11 | 1000 | ++ |
| Evaluation Example 2-38 | Example composition No. 11 | 2000 | ++ |
| Evaluation Example 2-39 | Example composition No. 11 | 5000 | ++ |

TABLE 8

| | Etching liquid composition | Copper concentration/ppm | Variation of wire width |
|---|---|---|---|
| Comparative Example 10 | Comparative composition 1 | 0 | unmeasurable |
| Comparative Example 11 | Comparative composition 1 | 1000 | unmeasurable |
| Comparative Example 12 | Comparative composition 1 | 2000 | unmeasurable |
| Comparative Example 13 | Comparative composition 2 | 0 | unmeasurable |
| Comparative Example 14 | Comparative composition 2 | 1000 | unmeasurable |
| Comparative Example 15 | Comparative composition 2 | 2000 | unmeasurable |
| Comparative Example 16 | Comparative composition 3 | 0 | unmeasurable |
| Comparative Example 17 | Comparative composition 3 | 1000 | unmeasurable |
| Comparative Example 18 | Comparative composition 3 | 2000 | unmeasurable |

From the results in Tables 6 to 8, it can be seen that in Evaluation Examples 2-1, 2-4 to 2-8, 2-12, 2-15, 2-18 to 2-39, it was possible to form wires having high linearity. Meanwhile, wires having high linearity could not be formed in Evaluation Examples 2-2, 2-3, 2-9 to 2-11, 2-13, 2-14, 2-16 and 2-17. Since wires could not be formed in Comparative Examples 10 to 18, it was impossible to measure the variations of wire width.

The invention claimed is:

1. An etching method for etching in one step a titanium-based layer and a copper-based layer of a laminate that is disposed on a base material and includes at least one titanium-based layer and at least one copper-based layer, the etching method comprising using an etching liquid composition comprising:
   (A) 0.1 to 15 mass % of hydrogen peroxide;
   (B) 0.01 to 1 mass % of a fluoride ion source;
   (C) 2-hydroxyethane sulfonic acid or a salt thereof in an amount of 0.1 to 20 mass % in terms of organic sulfonic acid;
   (D) 0.01 to 5 mass % of at least one compound selected from the group consisting of azole-based compounds and compounds having a structure that has a 6-membered heterocycle including at least one nitrogen atom and three double bonds; and
   (E) water.

2. The etching method of claim 1, wherein component (D) is at least one compound selected from the group consisting of 1,2,4-triazole, 3-amino-1H-triazole, 1H-tetrazole, 5-methyl-1H-tetrazole and 5-aminotetrazole.

3. An etching method, comprising: using an etching liquid composition to etch in one step a titanium-based layer and a copper-based layer of a material to be etched, that is a laminate disposed on a base material and that includes at least one titanium-based layer and at least one copper-based layer; and thereafter using the etching liquid composition again to etch another material to be etched,
   wherein the etching liquid composition comprising:
   (A) 0.1 to 15 mass % of hydrogen peroxide;
   (B) 0.01 to 1 mass % of a fluoride ion source;
   (C) 2-hydroxyethane sulfonic acid or a salt thereof in an amount of 0.1 to 20 mass % in terms of organic sulfonic acid;
   (D) 0.01 to 5 mass % of at least one compound selected from the group consisting of azole-based compounds and compounds having a structure that has a 6-membered heterocycle including at least one nitrogen atom and three double bonds; and
   (E) water.

4. The etching method of claim 3, wherein component (D) is at least one compound selected from the group consisting of 1,2,4-triazole, 3-amino-1H-triazole, 1H-tetrazole, 5-methyl-1H-tetrazole and 5-aminotetrazole.

* * * * *